(12) United States Patent
Campbell et al.

(10) Patent No.: US 7,408,776 B2
(45) Date of Patent: Aug. 5, 2008

(54) CONDUCTIVE HEAT TRANSPORT COOLING SYSTEM AND METHOD FOR A MULTI-COMPONENT ELECTRONICS SYSTEM

(75) Inventors: Levi A. Campbell, Poughkeepsie, NY (US); Richard C. Chu, Hopewell Junction, NY (US); Michael J. Ellsworth, Jr., Lagrangeville, NY (US); Madhusudan K. Iyengar, Woodstock, NY (US); Randall G. Kemink, Poughkeepsie, NY (US); Roger R. Schmidt, Poughkeepsie, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 71 days.

(21) Appl. No.: 11/539,905

(22) Filed: Oct. 10, 2006

(65) Prior Publication Data

US 2008/0084668 A1    Apr. 10, 2008

(51) Int. Cl.
*H05K 7/20* (2006.01)
*F28F 7/00* (2006.01)

(52) U.S. Cl. ............... 361/699; 165/80.4; 361/702; 361/711

(58) Field of Classification Search ............... None
See application file for complete search history.

(56) References Cited

U.S. PATENT DOCUMENTS

| 5,801,924 | A  | * | 9/1998 | Salmonson | 361/719 |
|---|---|---|---|---|---|
| 6,587,343 | B2 | * | 7/2003 | Novotny et al. | 361/698 |
| 6,967,841 | B1 | * | 11/2005 | Chu et al. | 361/700 |
| 6,967,842 | B2 | * | 11/2005 | Aoki et al. | 361/701 |
| 7,011,143 | B2 |   | 3/2006 | Corrado et al. | 165/80.4 |
| 7,012,807 | B2 | * | 3/2006 | Chu et al. | 361/699 |

(Continued)

OTHER PUBLICATIONS

Colbert et al., "Method and Apparatus for Mounting a Heat Sink in Thermal Contact with an Electronic Component", U.S. Appl. No. 11/201,972, filed Aug. 11, 2005.
Colbert et al., "Heatsink Apparatus for Applying a Specified Compressive Force to an Integrated Circuit Device", U.S. Appl. No. 11/460,334, filed Jul. 27, 2006.

*Primary Examiner*—Gregory D Thompson
(74) *Attorney, Agent, or Firm*—Lily Neff, Esq.; Kevin P. Radigan, Esq.; Heslin Rothenberg Farley & Mesiti P.C.

(57) ABSTRACT

A conductive heat transport cooling system and method are provided for cooling primary and secondary heat generating components of an electronics system. The cooling system includes a liquid-based cooling subsystem including at least one liquid-cooled cold plate physically coupled to at least one primary heat generating component of the electronics system, and a thermally conductive coolant-carrying tube coupled to and in fluid communication with the at least one liquid-cooled cold plate. A thermally conductive auxiliary structure is coupled to the coolant-carrying tube and to at least one secondary heat generating component of the electronics system. When in use, the thermally conductive auxiliary structure provides conductive heat transport from the at least one secondary heat generating component to the at least one thermally conductive coolant-carrying tube coupled thereto, and hence via convection to liquid coolant passing therethrough.

17 Claims, 7 Drawing Sheets

U.S. PATENT DOCUMENTS

| | | | |
|---|---|---|---|
| 7,203,063 B2 * | 4/2007 | Bash et al. | 361/699 |
| 7,252,139 B2 * | 8/2007 | Novotny et al. | 165/80.2 |
| 7,325,588 B2 * | 2/2008 | Malone et al. | 165/80.2 |
| 2004/0095721 A1 * | 5/2004 | Ellsworth et al. | 361/694 |
| 2007/0125523 A1 * | 6/2007 | Bhatti et al. | 165/104.33 |

* cited by examiner

CONDUCTIVE HEAT TRANSPORT COOLING SYSTEM AND METHOD FOR A MULTI-COMPONENT ELECTRONICS SYSTEM

CROSS-REFERENCE TO RELATED APPLICATIONS

This application contains subject matter which is related to the subject matter of the following applications, each of which is assigned to the same assignee as this application and each of which is hereby incorporated herein by reference in its entirety:

"Hybrid Cooling System and Method for a Multi-Component Electronics System", Campbell et al., Ser. No. 11/539,902, filed Oct. 10, 2006;

"Method of Assembling a Cooling System for a Multi-Component Electronics System", Campbell et al., Ser. No. 11/539,907, filed Oct. 10, 2006;

"Liquid-Based Cooling System for Cooling a Multi-Component Electronics System", Campbell et al., Ser. No. 11/539,910, filed Oct. 10, 2006;

"Method and Apparatus for Mounting a Heat Sink in Thermal Contact with an Electronic Component", Colbert et al, Ser. No. 11/201,972, filed Aug. 11, 2005, and published on Feb. 15, 2007 as U.S. Patent Publication No. US 2007/0035937 A1; and "Heatsink Apparatus for Applying a Specified Compressive Force to an Integrated Circuit Device", Colbert et al, Ser. No. 11/460,334, filed Jul. 27, 2006, and published on Jan. 31, 2008 as U.S. Patent Publication No. US 2008/0024991 A1.

TECHNICAL FIELD

The present invention relates in general to cooling an electronics system, and more particularly, to a conductive heat transport based cooling approach which facilitates cooling of secondary heat generating components of an electronics system using one or more thermally conductive auxiliary structures coupled to a thermally conductive coolant-carrying tube facilitating passage of liquid coolant through one or more liquid-cooled cold plates coupled to one or more primary heat generating components of the electronics system to be cooled.

BACKGROUND OF THE INVENTION

The power dissipation of integrated circuit chips, and the modules containing the chips, continues to increase in order to achieve increases in processor performance. This trend poses a cooling challenge at both the module and system level. Increased air flow rates are needed to effectively cool high power modules and to limit the temperature of air exhausted into the computer center.

In many large server applications, processors along with their associated electronics (e.g., memory, disk drives, power, etc.), are packaged in removable drawer configurations stacked or aligned within a rack or frame. In other cases, the electronics may be in fixed locations within the rack or frame. Typically, the components are cooled by air moving in parallel air flow paths, usually front-to-back, impelled by one or more air moving devices (e.g., fans or blowers). In some cases it may be possible to handle increased power dissipation within a single drawer by providing greater air flow, for example, through the use of a more powerful air moving device or by increasing the rotational speed (i.e., RPM) of an existing air moving device. However, this approach is becoming unmanageable at the frame level in the context of a computer installation (e.g., data center).

The sensible heat load carried by the air exiting the frame will eventually exceed the ability of room air conditioning to effectively handle the load. This is especially true for large installations of "server farms" or large banks of computer frames close together. In such installations, not only will the room air conditioning be challenged, but the situation may also result in recirculation problems with some fraction of the "hot" air exiting one frame being drawn into the air inlet of the same or a nearby frame. Furthermore, while the acoustic noise level of a powerful (or higher RPM) air moving device in a single drawer may be within acceptable acoustic limits, because of the number of air moving devices in the frame, the total acoustic noise at the frame level may not be acceptable. In addition, the conventional openings in the frame for the entry and exit of air flow make it difficult, if not impossible to provide effective acoustic treatment to reduce the acoustic noise level outside the frame. Finally, as operating frequencies continue to increase, electromagnetic cross talk between tightly spaced computer frames is becoming a problem largely due to the presence of the openings in the covers.

SUMMARY OF THE INVENTION

The shortcomings of the prior art are overcome, and additional advantages are realized through the provision, in one aspect, of an enhanced cooling system for a multi-component electronics system. The multi-component electronics system includes at least one primary heat generating component to be cooled and at least one secondary heat generating component to be cooled. The cooling system includes a liquid-based cooling subsystem and a thermally conductive auxiliary structure. The liquid-based cooling subsystem includes at least one liquid-cooled cold plate configured to couple to the at least one primary heat generating component to be cooled. The liquid-based cooling subsystem further includes at least one thermally conductive coolant-carrying tube coupled to and in fluid communication with the at least one liquid-cooled cold plate for facilitating passage of liquid coolant through the at least one liquid-cooled cold plate. The thermally conductive auxiliary structure is coupled to the at least one thermally conductive coolant-carrying tube and is configured to couple to the at least one secondary heat generating component to be cooled. When the cooling system is in use with the at least one liquid-cooled cold plate coupled to the at least one primary heat generating component to be cooled and the thermally conductive auxiliary structure coupled to the at least one secondary heat generating component to be cooled, the thermally conductive auxiliary structure provides conductive heat transport from the at least one secondary heat generating component to the at least one thermally conductive coolant-carrying tube coupled thereto and hence via convection to liquid coolant passing therethrough.

In another aspect, a cooled electronics system is provided which includes at least one electronics drawer containing multiple components, and a cooling system for cooling the multiple components. The electronics drawer includes at least one primary heat generating and at least one secondary heat generating component to be cooled. The cooling system includes a liquid-based cooling subsystem and a thermally conductive auxiliary structure. The liquid-based cooling subsystem includes at least one liquid-cooled cold plate coupled to the at least one primary heat generating component to be cooled, and at least one thermally conductive coolant-carrying tube coupled to and in fluid communication with the at least one liquid-cooled cold plate for facilitating passage of liquid coolant through the at least one liquid-cooled cold plate. The thermally conductive auxiliary structure is coupled to the at least one thermally conductive coolant-carrying tube and is coupled to the at least one secondary heat generating component to be cooled. When in use, the thermally conductive auxiliary structure provides conductive heat transport from the at least one secondary heat generating component to the at least one thermally conductive coolant-carrying tube coupled thereto, and hence via convection to liquid coolant passing therethrough.

In a further aspect, a method of fabricating a cooling system is provided for a multi-component electronics system. The method includes: providing a liquid-based cooling subsystem comprising at least one liquid-cooled cold plate configured to physically couple to at least one primary heat generating component of the multi-component electronics system for liquid-based cooling thereof, the liquid-based cooling subsystem further including at least one thermally conductive coolant-carrying tube coupled to and in fluid communication with the at least one liquid-cooled cold plate for facilitating passage of liquid coolant through the at least one liquid-cooled cold plate; and coupling a thermally conductive auxiliary structure to the at least one thermally conductive coolant-carrying tube, the thermally conductive auxiliary structure being configured to couple to at least one secondary heat generating component of the multi-component electronics system. When the cooling system is in use, with the at least one liquid-cooled cold plate coupled to the at least one primary heat generating component to be cooled and the thermally conductive auxiliary structure coupled to the at least one secondary heat generating component to be cooled, the thermally conductive auxiliary structure provides conductive heat transport from the at least one secondary heat generating component to the at least one thermally conductive coolant-carrying tube coupled thereto, and hence via convection to liquid coolant passing therethrough.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

BEST MODE FOR CARRYING OUT THE INVENTION

As used herein "electronics system" comprises any system containing one or more heat generating components of a computer system or other electronics unit requiring cooling. The terms "electronics rack", "electronics frame", and "frame" are used interchangeably, and include any housing, rack, compartment, blade chassis, etc., having heat generating components of a computer system or electronics system and may be for example, a stand-alone computer processor having high, mid or low end processing capability. In one embodiment, an electronics frame comprises multiple electronics drawers, each having multiple heat generating components disposed therein requiring cooling. "Electronics drawer" refers to any sub-housing, blade, book, drawer, node, compartment, etc., having multiple heat generating electronic components disposed therein. Each electronics drawer of an electronics frame may be movable or fixed relative to the electronics frame, with rack mounted electronics drawers and blades of a blade center system being two examples of drawers of an electronics frame to be cooled.

"Electronic component" refers to any heat generating electronic component of, for example, a computer system or other electronics unit requiring cooling. By way of example, an electronic component may comprise one or more integrated circuit chips and/or other electronic devices to be cooled, including one or more processor modules, memory modules and memory support modules. As used herein, "primary heat generating component" refers to a primary heat generating electronic component within the electronics system (with a processor module being one example), while "secondary heat generating component" refers to an electronic component of the electronics system generating less heat than the primary heat generating component to be cooled (with memory modules and memory support modules being examples of secondary components to be cooled). Further, as used herein, the term "liquid-cooled cold plate" refers to any conventional thermally conductive structure having a plurality of channels or passageways formed therein for flowing of liquid coolant therethrough.

Figure 1:
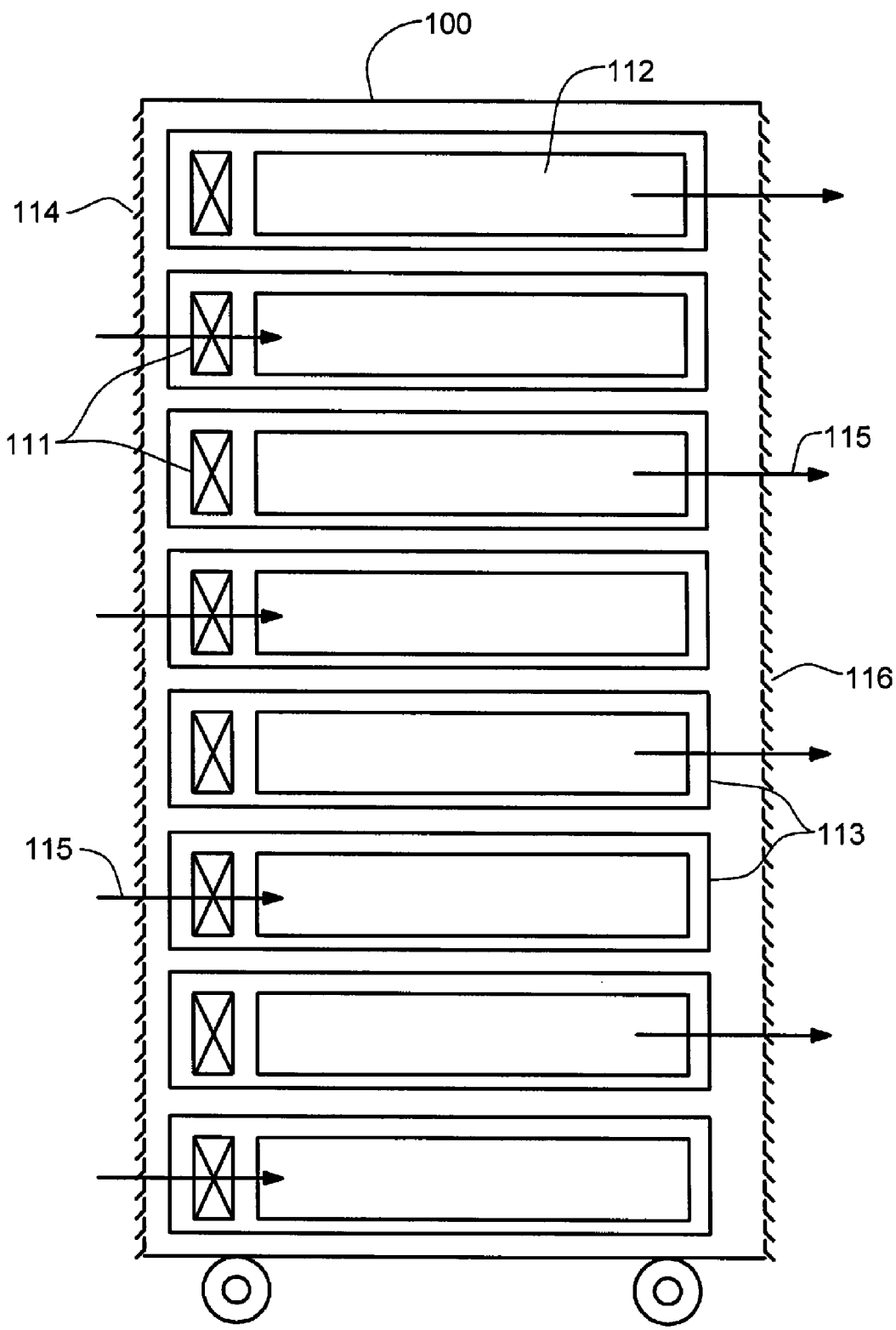
FIG. 1 depicts one embodiment of a conventional air-cooled electronics frame with heat generating electronic components disposed in removable electronics drawers.

As shown in FIG. 1, in rack-mounted configurations typical in the prior art, a plurality of air moving devices 111 (e.g., fans or blowers) provide forced air flow 115 needed to cool the electronic components 112 within the electronics drawers 113 of the frame 100. Cool air is taken in through a louvered inlet cover 114 in the front of the frame and exhausted out a louvered outlet cover 116 in the back of the frame.

Figure 2:
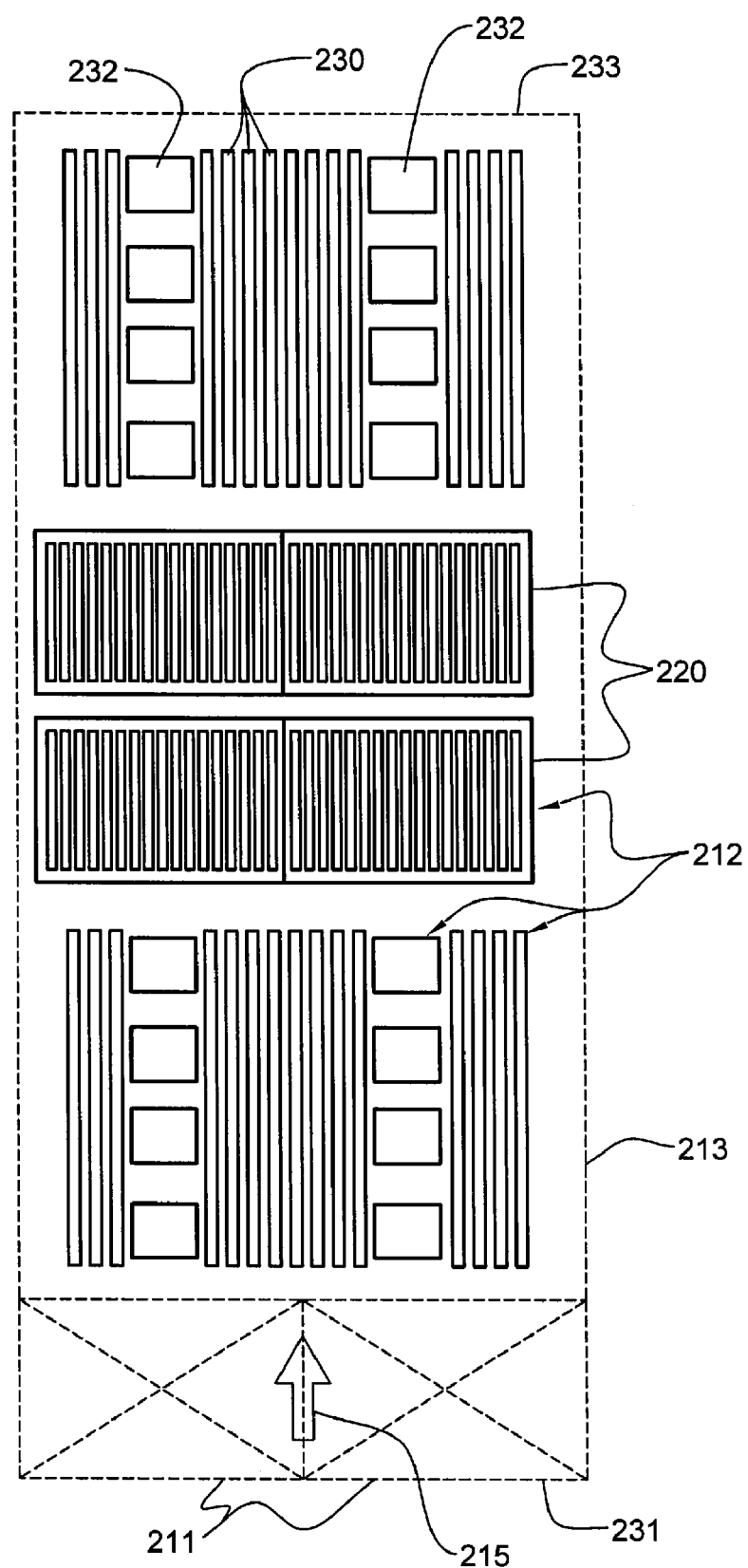
FIG. 2 is a plan view of one embodiment of an electronics drawer layout illustrating multiple electronic components to be cooled, in accordance with an aspect of the present invention.

FIG. 2 illustrates one embodiment of a multi-component electronics drawer 213 having a component layout in accordance with an aspect of the present invention. Electronics drawer 213 includes one or more air moving devices 211 (e.g., fans or blowers) which provide forced air flow 215 across the multiple electronic components 212 within electronics drawer 213. Cool air is taken in through a front 231 of electronics drawer 213 and exhausted out a back 233 of the electronics drawer. In this embodiment, the multiple electronic components to be cooled 212 include processor modules disposed below air-cooled heat sinks 220, as well as (by way of example) arrayed memory modules 230 (such as air-cooled dual in-line memory module (DIMM) packages), and multiple rows of memory support modules 232 disposed between the arrayed memory modules.

Those skilled in the art will note that although described herein in association with DIMM packages, and their memory support modules, the concepts presented are applicable to facilitating cooling of any secondary heat generating component within an electronics system. Again, the terms "primary heat generating component" and "secondary heat generating component" are used to differentiate between heat generating capabilities of components within the electronics system. By way of example, processor modules typically generate more heat than, for example, memory modules or memory support modules, and therefore are deemed primary heat generating components within the electronics system, while the memory modules and memory support modules are referred to herein as secondary heat generating components.

As illustrated further in one or more of the initially incorporated applications (as well as in FIGS. 6A & 6B hereof), each DIMM package includes a short rectangular substrate plugged into a connector on a motherboard at the bottom of the electronics drawer, and projects upward from the motherboard. Memory chips are surface-mounted in a line on the DIMM substrate parallel to the air flow direction through the electronics drawer. A number of DIMMs are pluggable in closely spaced position across the electronics drawer, forming multiple air flow channels or passageways between the DIMMs which extend at least partially through the electronics drawer.

In order to provide greater performance, it will eventually be necessary to increase processor chip powers beyond the point where forced air-cooling is feasible as a solution. Because of their level of power dissipation, the memory support modules and/or memory modules themselves may also require the application of auxiliary cooling to be effectively cooled. To meet these increased cooling demands, a cooling system may be provided with a liquid-based cooling subassembly including at least one liquid-cooled cold plate physically coupled to the at least one primary heat generating component (e.g., processor module) to be cooled.

Figures 3, 3A:
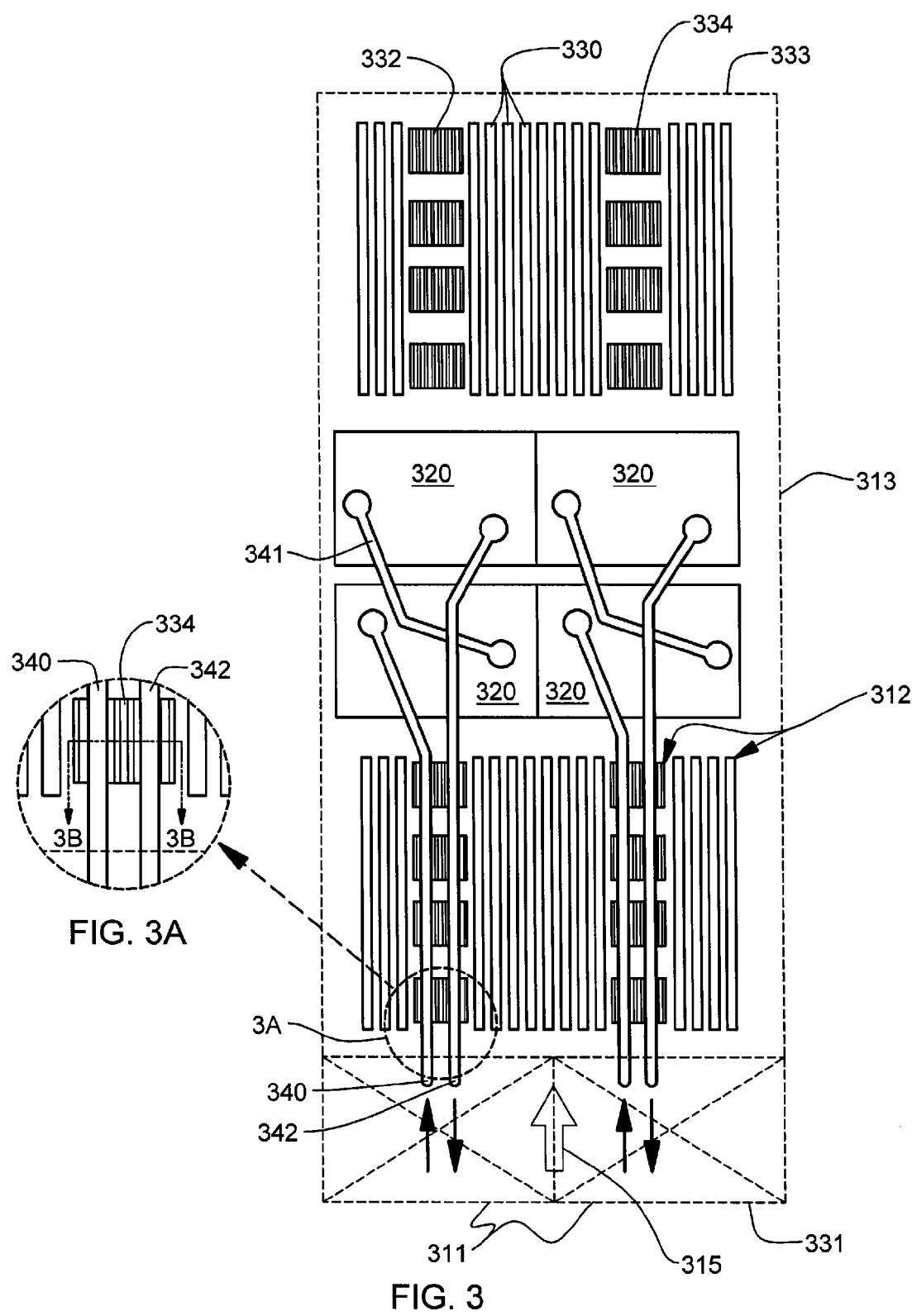
FIG. 3 is a plan view of the electronics drawer layout of FIG. 2 illustrating one embodiment of a cooling system for cooling the components of the drawer, in accordance with an aspect of the present invention.
FIG. 3A is a partially enlarged view of the assembly of FIG. 3 expanded within circle 3A of FIG. 3, in accordance with an aspect of the present invention.

FIG. 3 is a simplified depiction of the electronics drawer component layout of FIG. 2, with such a cooling system shown. In the embodiment depicted, the cooling system includes a liquid-based cooling subsystem and multiple sets of thermally conductive coolant-carrying tubes, in accordance with an aspect of the present invention.

More particularly, FIG. 3 depicts one embodiment of an electronics drawer 313 component layout wherein one or more air moving devices 311 provide forced air flow 315 to cool multiple components 312 within electronics drawer 313. Cool air is taken in through a front 331 and exhausted out a back 333 of the drawer. The multiple components 312 to be cooled include multiple processor modules to which liquid-cooled cold plates 320 are coupled, as well as multiple arrays of memory modules 330 (e.g., dual in-line memory modules (DIMMs) configured as described above in connection with memory modules 230 of FIG. 2) and multiple rows of memory support modules (332, FIG. 3B) (e.g., DIMM control modules) to which air-cooled heat sinks 334 are coupled. In the embodiment illustrated, memory modules 330 and the memory support modules are partially arrayed near front 331 of electronics drawer 313, and partially arrayed near back 333 of electronics drawer 313. Also, in the embodiment of FIG. 3, memory modules 330 and the memory support modules (below air-cooled heat sinks 334) are cooled by air flow 315 across the electronics drawer.

The thermally conductive coolant-carrying tubes in the embodiment of FIG. 3 comprise sets of coolant-carrying tubes, with each set including a thermally conductive coolant supply tube 340 and a thermally conductive coolant return tube 342. In this example, each set of tubes provides liquid coolant to a pair of cold plates 320 (coupled to a pair of processor modules). Coolant flows into a first cold plate of the pair via the thermally conductive coolant supply tube 340 and from the first cold plate to the second cold plate via a bridge tube or line 341, which may or may not be thermally conductive. From the second cold plate of the pair, coolant is returned through the respective thermally conductive coolant return tube 342. In an alternate embodiment, only the supply tube 340 or the return tube 342 is thermally conductive, e.g., fabricated of a metal (such as copper or aluminum), with the other tube being, for example, a flexible, non-thermally conductive coolant-carrying line or hose. The auxiliary structures presented herein below couple to at least one thermally conductive coolant-carrying tube, which itself is coupled to and in fluid communication with at least one liquid-cooled cold plate (coupled to at least one primary heat generating component to be cooled).

In an alternate implementation, eight processor modules might be disposed within the electronics drawer, each requiring a respective liquid-cooled cold plate 320 coupled thereto, as well as associated coolant-carrying tubes for facilitating passage of liquid coolant through the liquid-cooled cold plates. In either embodiment, an inlet header and an outlet header may be employed within the electronics drawer to facilitate distribution of liquid coolant to and return of the liquid coolant from the liquid-cooled cold plates. Ultimately, only two tubes or valves may extend from each electronics drawer of a frame, which are in communication with the inlet and outlet headers. Further, by way of specific example, the liquid coolant passing through the liquid-based cooling subsystem may be chilled water.

Figure 3B:
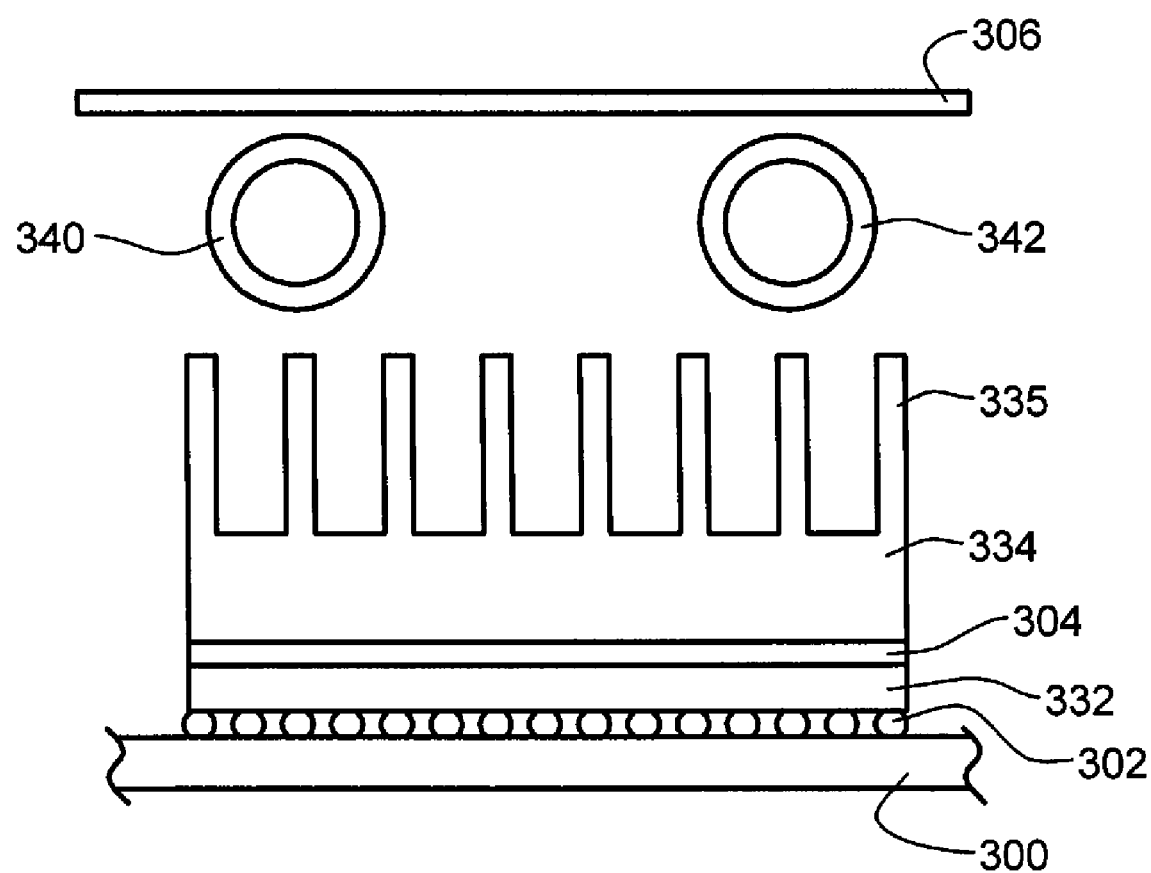
FIG. 3B is a partial cross-sectional elevational view of the structure of FIG. 3A taken along line 3B-3B, in accordance with an aspect of the present invention.

FIGS. 3A & 3B depict in greater detail one aspect of the cooling system of FIG. 3. As best shown in FIG. 3B, memory support module 332 is coupled to a substrate 300 via, for example, appropriate electrical interconnect 302. A thermal interface material 304 (such as a thermal paste) couples air-cooled heat sink 334 to memory support module 332. Air-cooled heat sink 334 includes a plurality of upwardly projecting thermally conductive fins 335. In this embodiment, the plurality of thermally conductive fins 335 are sized to accommodate overhead a thermally conductive coolant supply tube 340 and a thermally conductive coolant return tube 342 providing liquid coolant to one or more liquid-cooled cold plates of the cooling system. A cover 306 encloses the assembly.

One disadvantage of implementing a cooling system in a manner such as depicted in FIGS. 3, 3A & 3B is that the fins of the air-cooled heat sinks 334 need to be modified to accommodate overhead the liquid coolant plumbing for the drawer. Reduction in the size of these thermally conductive fins can decrease thermal performance of the air-cooled heat sinks, and consequently, result in higher temperatures at the circuitry of the memory support modules. Thus, in one aspect, provided herein are cooling systems which address cooling of secondary heat generating components whose traditional air-cooling capability may be diminished due to the inclusion of liquid coolant hardware within an electronics drawer. In another aspect, presented herein are cooling systems which facilitate cooling of additional, secondary heat generating components such as memory modules (e.g., dual in-line memory modules). In view of the above-noted DIMM geometry and close spacing, an enhanced cooling system and method are also presented which utilize a thermally conductive auxiliary structure extending outward over the DIMMs and coupled to one or more of the thermally conductive coolant-carrying tubes (facilitating passage of coolant to the liquid-cooled cold plates attached to the processor modules). As used herein, the phrases "coupled" and "physically coupled" refer to either a direct or indirect physical coupling (for example, of the auxiliary structure to at least one thermally conductive coolant-carrying tube).

In the embodiments described herein, the cooling system and method presented employ conductive heat transport from at least one secondary heat generating component to at least one thermally conductive coolant-carrying tube using one or more thermally conductive auxiliary structures, wherein the at least one thermally conductive coolant-carrying tube facilitates passage of liquid coolant through one or more liquid-cooled cold plates configured to couple to one or more primary heat generating components of an electronics system to be cooled. By way of example, FIGS. 4A-5B depict alternate embodiments of a thermally conductive auxiliary structure for facilitating conductive heat transport between one or more memory support modules and one or more thermally conductive coolant-carrying tubes, while FIGS. 6A & 6B depict one embodiment of a thermally conductive auxiliary structure which facilitates conductive heat transport from multiple memory modules to one or more thermally conductive coolant-carrying tubes. In these embodiments, the memory support modules and the memory modules are exemplary secondary heat generating components to be cooled, with the processor modules being an exemplary of primary heat generating components to be cooled of an electronics system (such as a high performance server application).

Figure 4A:
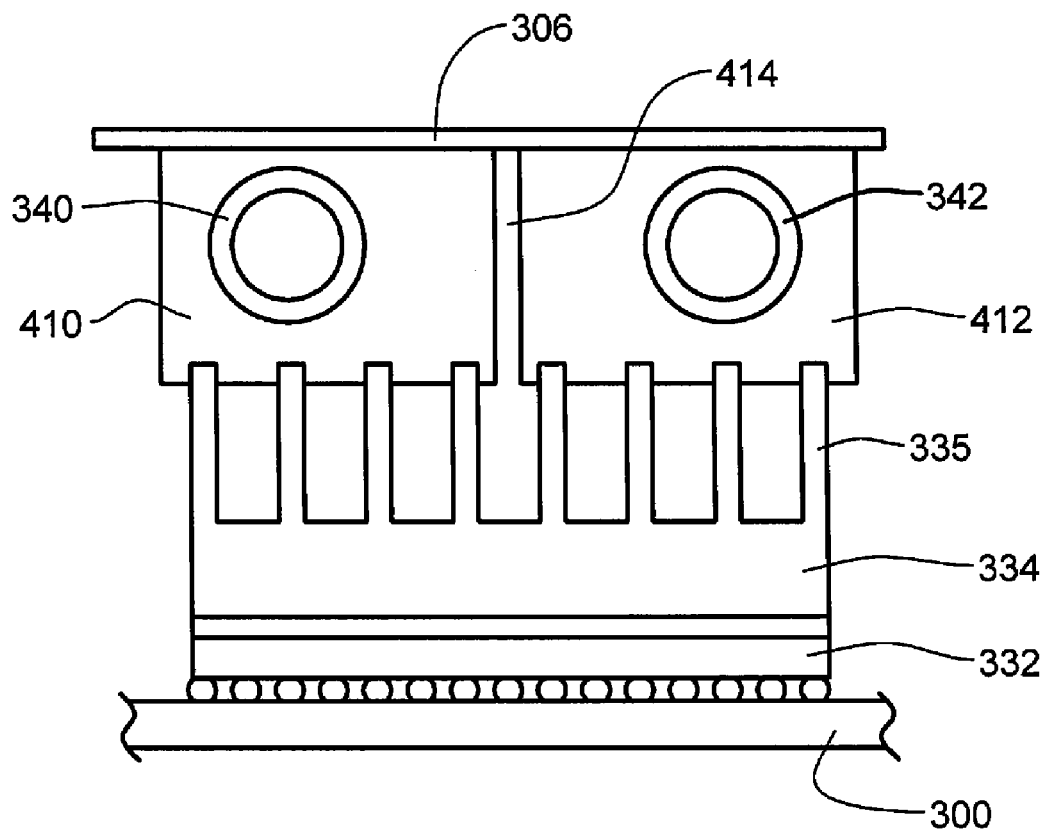
FIG. 4A is a partial elevational view of an air-cooled heat sink and secondary heat generating component of the electronics drawer component layout of FIG. 3, and depicting multiple thermally conductive auxiliary structures of a cooling system disposed to cool by conductive heat transport the air-cooled heat sink and hence the secondary heat generating component coupled thereto, in accordance with an aspect of the present invention.
Figure 4B:
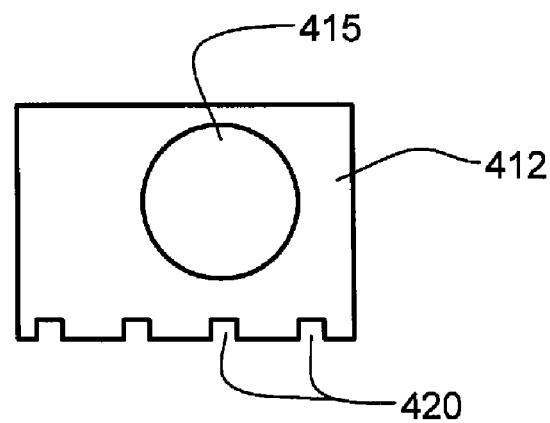
FIG. 4B is an elevational view of one thermally conductive auxiliary structure depicted in FIG. 4A, in accordance with an aspect of the present invention.

Referring first to FIGS. 4A & 4B, memory support module 332 is again supported by and electrically connected to a substrate 300 and employs an air-cooled heat sink 334 having a plurality of thermally conductive fins 335. The cooling system includes, in this embodiment, multiple thermally conductive auxiliary structures 410, 412 which provide direct conductive heat transport between air-cooled heat sink 334 and thermally conductive coolant supply and return tube 340, 342. Thermally conductive auxiliary structures 410, 412 (which are shown contacting cover 306) are each, in one example, a block- or rectangular-shaped structure having an opening (such as opening 415 in thermally conductive auxiliary structure 412 shown in FIG. 4B) sized and configured to accommodate a respective thermally conductive coolant distribution tube 340, 342, which assumes that both the supply and return tubes are thermally conductive coolant-carrying tubes. In an alternate example, thermally conductive auxiliary structures 410, 412 each comprise multiple sections or components assembled to surround the respective thermally conductive coolant distribution tube 340, 342. Fabricating the auxiliary structures of multiple sections would facilitate retrofitting an existing cooling system with the auxiliary cooling presented herein. Further, as a variation, vapor chambers, heat pipes or liquid-filled structures could be integrated within the thermally conductive auxiliary structures. Since thermally conductive auxiliary structure 410 encircles, and is physically coupled to, coolant supply tube 340, and thermally conductive auxiliary structure 412 encircles, and is physically coupled to, coolant return tube 342, the auxiliary structures are spaced apart 414 to prevent direct thermal coupling between the thermally conductive coolant supply and return tubes. Note also that in this example, it is assumed that cover 306 is fabricated of a non-thermally conductive material.

Each thermally conductive auxiliary structure 410, 412 includes a plurality of channels (such as channels 420 in thermally conductive auxiliary structure 412 shown in FIG. 4B) positioned and configured to accommodate respective ones of the plurality of thermally conductive fins 335 of air-cooled heat sink 334. These channels accommodate the respective fins of the air-cooled heat sink in such a manner that the fins physically couple to the auxiliary structure. As noted, and although not fully shown, structures 410, 412 are each configured (in one example) as a unitary block of thermally conductive material (e.g., copper or aluminum) sized to extend over at least a portion of the air-cooled heat sink(s) to receive auxiliary cooling. For example, each memory support module in the rows of memory support modules having the thermally conductive coolant distribution tubes extending overhead may have one or more thermally conductive auxiliary structures physically coupled thereto to provide conductive heat transport from the air-cooled heat sinks coupled thereto to the thermally conductive coolant-carrying tube(s), and hence via convection to liquid coolant flowing through the tube(s).

In one specific embodiment, thermally conductive auxiliary structures can each be fabricated as a rectangular sleeve having a cylindrical cavity, with the rectangular sleeves being metallurgically joined to the thermally conductive coolant-carrying tubes. The channels formed in the auxiliary structures may be formed as grooves or slots cut into, for example, the planar surface of the structure facing an air-cooled heat sink attached to the secondary heat generating component to be cooled. These channels in the auxiliary structure mate with the fins of the heat sink to ensure good thermal contact and to allow heat to be extracted from the tips of the fins for transport ultimately to the liquid coolant passing through the coolant-carrying tubes. Thus, in this embodiment, heat dissipated by the secondary heat generating component (e.g., such as a memory controller chip) is removed by a combination of two modes; i.e., via convective heat transfer to air, and via conductive heat transfer through the auxiliary structure (ultimately to liquid coolant flowing through the thermally conductive coolant-carrying tubes). A thermal interface material, such as a thermally conductive grease, may be employed in the channels of the auxiliary structures to facilitate conductive heat transport from the fins of the air-cooled heat sinks to the auxiliary structures. As a variation, the auxiliary structures need not be metallurgically joined to the coolant-carrying tubes, but rather, the auxiliary structures may be press-fitted (e.g., if one-piece) or clamped (e.g., if two-pieces) onto the coolant-carrying tubes using a thermal interface material to ensure good contact for conductive heat transport.

Figure 5A:
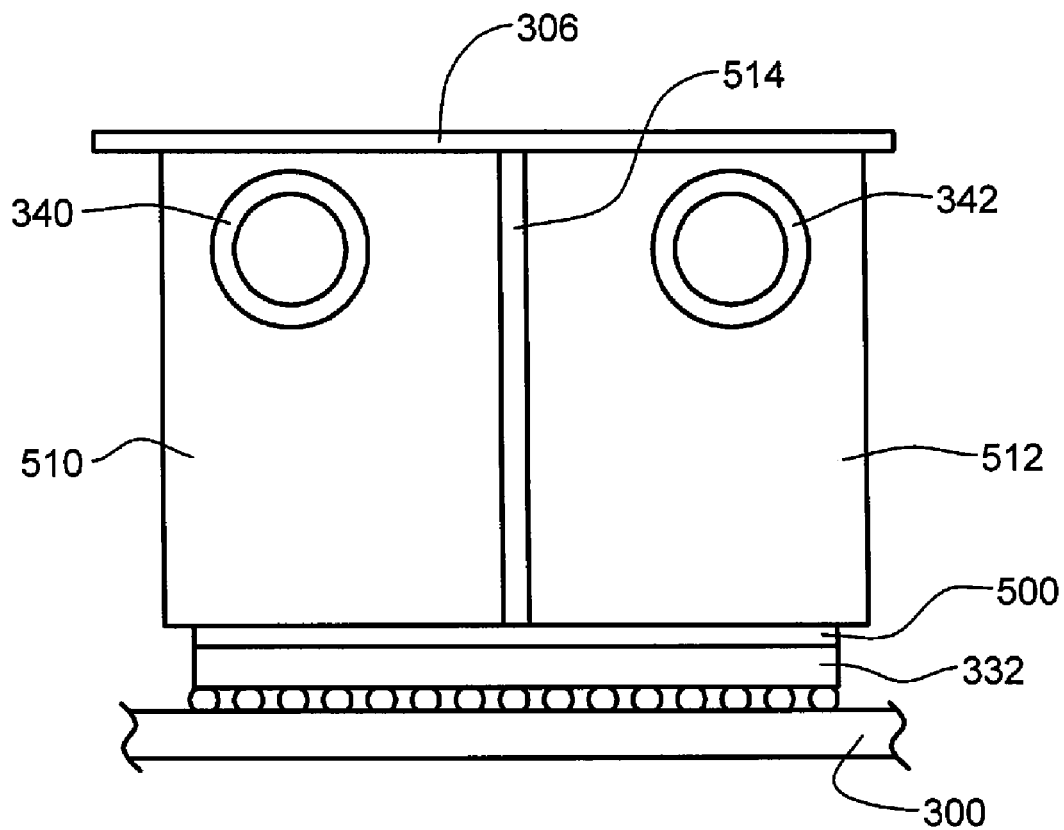
FIG. 5A is a partial elevational view of a secondary heat generating component of the electronics drawer component layout of FIG. 3, and showing an alternate embodiment of multiple thermally conductive auxiliary structures of a cooling system disposed to cool by conductive heat transport the secondary heat generating component, in accordance with an aspect of the present invention.
Figure 5B:
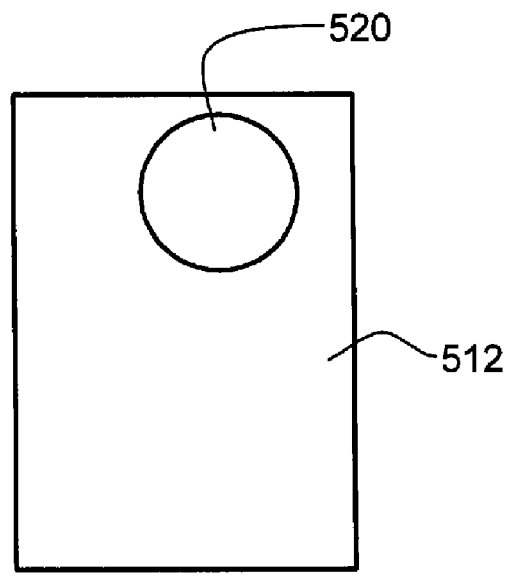
FIG. 5B is an elevational view of one thermally conductive auxiliary structure depicted in FIG. 5A, in accordance with an aspect of the present invention.
Figure 6A:
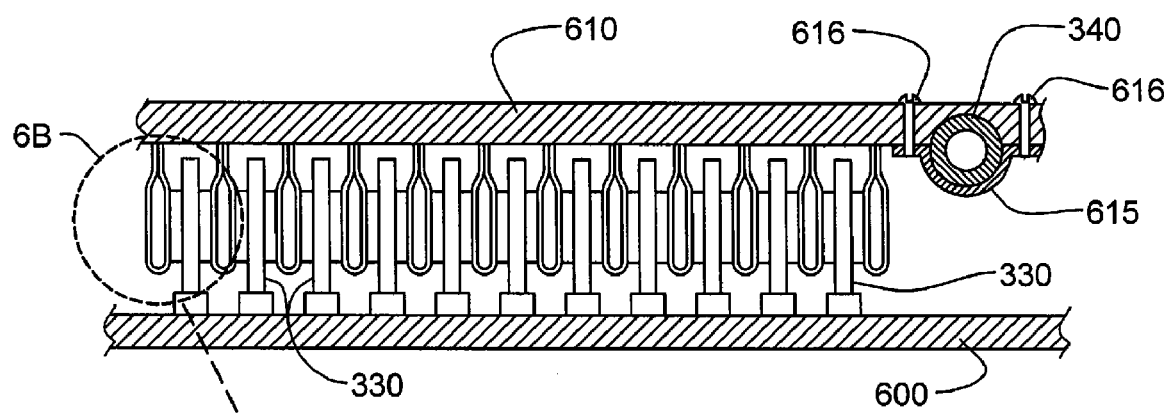
FIG. 6A is a partial cross-sectional elevational view of the electronics drawer component layout of FIG. 3, and depicting folded fin structures of a thermally conductive auxiliary structure of a cooling system disposed to cool by conductive heat transport selected secondary heat generating electronic components of the electronics drawer, in accordance with an aspect of the present invention.
Figure 6B:
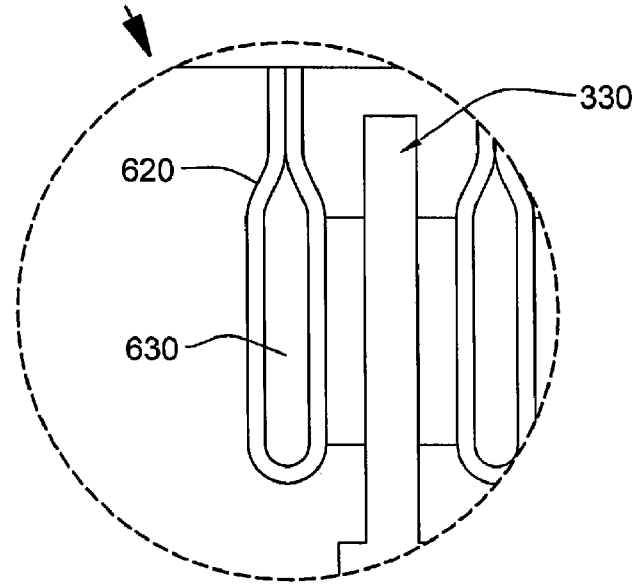
FIG. 6B is an enlarged partial depiction of the folded fin structures of the cooling system of FIG. 6A, in accordance with an aspect of the present invention.

FIGS. 5A & 5B depict an alternate embodiment of a thermally conductive auxiliary structure (or conduction cooler), in accordance with an aspect of the present invention.

As shown, a memory support module 332 is again supported by and electrically coupled to a substrate 300. In this case, the air-cooled heat sink of FIGS. 4A & 4B is removed and the thermally conductive auxiliary structures 510, 512 are sized and configured to at least partially couple to memory support module 332 across a thermal interface material layer 500. Each thermally conductive auxiliary structure 510, 512 is, in one example, a block- or rectangular-shaped structure (or rectangular sleeve_having a cylindrical opening (such as opening 520 in auxiliary structure 512 of FIG. 5B) sized and positioned to accommodate a respective one of the thermally conductive coolant-carrying tubes 340, 342. In an alternate example, thermally conductive auxiliary structures 510, 512 each comprise multiple sections or components assembled to surround the respective thermally conductive coolant distribution tube 340, 342. Fabricating the auxiliary structures of multiple sections would facilitate retrofitting an existing cooling system with the auxiliary cooling presented herein. Further, as a variation, vapor chambers, heat pipes or liquid-filled structures could be integrated within the thermally conductive auxiliary structures. Auxiliary structures 510, 512 also contact (in this embodiment) cover 306, which is again assumed to be fabricated of a non-thermally conductive material. An air space 514 is provided between thermally conductive auxiliary structure 510 encircling thermally conductive coolant-carrying tube 340 and thermally conductive auxiliary structure 512 encircling thermally conductive coolant return tube 342 to prevent conductive heat transport therebetween.

As with the embodiment of FIGS. 4A & 4B, the auxiliary structure (e.g., block or sleeve) may be metallurgically joined to the respective coolant-carrying tube, or alternatively, press-fitted or clamped to the tube employing a thermal interface material between the auxiliary structure and tube to ensure a good thermal interface. Heat is conductively transported from the secondary heat generating component (e.g., memory support module 332) to the thermally conductive coolant-carrying tube, and hence via convection to liquid coolant flowing through the coolant-carrying tube, thereby facilitating cooling of the secondary heat generating component employing the liquid coolant provided for the liquid-cooled cold plate coupled to the primary heat generating component to be cooled.

FIGS. 6A & 6B depict a further variation on a cooling system employing secondary conductive heat transport, in accordance with an aspect of the present invention.

In this embodiment, a plurality of DIMM packages (or memory modules 330) plug into and extend upward from a support substrate 600. The DIMM packages are spaced, with air flow passageways defined between the DIMM packages for cooling thereof. The cooling system includes a thermally conductive auxiliary structure 610 which, in this embodiment, includes a metal plate configured to accommodate and physically couple to one or more of the thermally conductive coolant-carrying tubes. In the embodiment of FIGS. 6A & 6B, thermally conductive auxiliary structure 610 is configured to accommodate at least thermally conductive coolant supply tube 340. A mounting bracket 615 removably secures thermally conductive auxiliary structure 610 to thermally conductive coolant supply tube 340 employing, for example, multiple connectors 616 (such as thread screws). A plurality of thermally conductive folded fin structures 620 extend downward (in this embodiment) from thermally conductive auxiliary structure 610 into the air flow passageways defined between adjacent DIMM packages. Those skilled in the art should note that (as used herein) the terms "upward" and "downward" are relative and can be reversed, depending on the implementation.

As best shown in FIG. 6B, each folded fin structure 620 is formed of a continuous thin conductive metal sheet folded to form two opposing sides drawn together at the top and bottom. If a force is applied to the outer face of either side, the folded fin structure acts in a manner similar to two leaf springs joined together at their ends. The folded fin structures are joined (for example, employing a thermal epoxy, solder or braze) to a base plate of the auxiliary structure so that a folded fin structure projects into each air flow passageway defined between adjacent memory modules (e.g., DIMM packages) to be cooled. During assembly, the auxiliary structure is brought down into the electronics drawer so that the folded fin structures enter the air flow passageways between adjacent DIMM packages. Each folded fin structure itself includes a smaller air flow passage 630 defined between the opposing sidewalls of the structure.

As shown in FIGS. 6A & 6B, the folded fin structures are rounded at their bottom to permit ease of entry of the fin structure between opposing memory chips on adjacent DIMM packages. As the cooling assembly is further inserted, the folded fin structures compress slightly, allowing full insertion of the folded fin structures between the DIMM packages. Upon completion of the assembly process, the face of each folded fin sidewall is physically coupled to an outer surface of the adjacent memory chip of an adjacent DIMM package, providing a thermal conduction path from the memory chip to the folded fin structure. In operation, heat flows by thermal conduction from each memory module to its contacting folded fin structure, and a certain amount of this heat is conducted via the fin structure to the base plate, and hence to the thermally conductive coolant-carrying tube coupled to the base plate. From the thermally conductive coolant-carrying tube, heat flows by convection to liquid coolant flowing through the tube. The remainder of the heat conducted into the folded fin structure is transferred by forced convection to air flowing in the open space 630 between the opposing sidewalls of the folded fin structure. Additional heat is also rejected from the remaining surfaces of the adjacent DIMM packages to air flowing in contact with the surfaces.

The thermally conductive auxiliary structures of the embodiments of FIGS. 6A-6B can be attached via mounting plates 615 joined to the underside of the coolant distribution line(s) by means of, for example, a thermally conductive epoxy, solder or braze around the lower half of the coolant-carrying pipe(s). The mounting plates extend outwards from the pipes to provide increased thermal contact area with the underside of the thermally conductive auxiliary structure, thereby reducing thermal contact resistance between the auxiliary structure(s) and the pipe(s). In one embodiment, the auxiliary structure and mounting plates are joined via threaded mechanical screws.

It should be also noted that it is sometimes necessary to replace or add DIMMs to a node in the field. Thus, one feature of the cooling systems described herein is that they allow servicing in the field. This is accomplished by withdrawing the node (i.e., electronics drawer) from the electronics rack and removing (i.e., in the embodiment of FIGS. 6A & 6B) the attachment screws from the thermally conductive auxiliary structure. The auxiliary structure may then be lifted and removed to allow access to unplug or plug DIMMs into the drawer's motherboard. As another feature of the cooling system disclosed herein, the system not only enhances the cooling of the secondary components (e.g., DIMM packages), it reduces the heat load on the customer room air conditioning by further reducing heat that is transferred to the air exiting each drawer of the electronics frame.

Although preferred embodiments have been depicted and described in detail herein, it will be apparent to those skilled in the relevant art that various modifications, additions, substitutions and the like can be made without departing from the spirit of the invention, and that these are therefore considered to be within the scope of the invention as defined in the following claims.

What is claimed is:

1. A cooling system for a multi-component electronics system comprising at least one primary heat generating component to be cooled and at least one secondary heat generating component to be cooled, the cooling system comprising:
a liquid-based cooling subsystem comprising at least one liquid-cooled cold plate configured to couple to the at least one primary heat generating component to be cooled of a multi-component electronics system, the liquid-based cooling subsystem further comprising at least one thermally conductive coolant-carrying tube coupled to and in fluid communication with the at least one liquid-cooled cold plate for facilitating passage of liquid coolant through the at least one liquid-cooled cold plate;
a thermally conductive auxiliary structure coupled to the at least one thermally conductive coolant-carrying tube and configured to couple to the at least one secondary heat generating component to be cooled, wherein when the cooling system is in use with the at least one liquid-cooled cold plate coupled to the at least one primary heat generating component to be cooled and the thermally conductive auxiliary structure coupled to the at least one secondary heat generating component to be cooled, the thermally conductive auxiliary structure provides conductive heat transport from the at least one secondary heat generating component to the at least one thermally conductive coolant-carrying tube coupled thereto, and hence via convection to liquid coolant passing therethrough; and
at least one air-cooled heat sink configured to couple to the at least one secondary heat generating component to be cooled, the at least one air-cooled heat sink comprising a plurality of thermally conductive fins, and wherein the cooling system further comprises multiple thermally conductive auxiliary structures, each thermally conductive auxiliary structure comprising a rectangular-shaped structure surrounding a thermally conductive coolant-carrying tube of the at least one thermally conductive coolant-carrying tube, and at least partially aligned over and coupled to the at least one air-cooled heat sink when the cooling system is employed to cool the multi-component electronics system, with the at least one air-cooled heat sink coupled to the at least one secondary heat generating component to be cooled.

2. The cooling system of claim 1, wherein the liquid-based cooling subsystem comprises multiple thermally conductive coolant-carrying tubes, the multiple thermally conductive coolant-carrying tubes comprising a thermally conductive coolant supply tube and a thermally conductive coolant return tube, and wherein each thermally conductive auxiliary structure is configured to couple to a respective thermally conductive coolant-carrying tube of the liquid-based cooling subsystem.

3. The cooling system of claim 2, wherein each thermally conductive auxiliary structure comprises multiple channels formed in at least one surface thereof and configured to receive and couple to respective thermally conductive fins of the plurality of thermally conductive fins of the at least one air-cooled heat sink when the cooling system is employed to cool the multi-component electronics system, with each thermally conductive auxiliary structure physically coupling to the respective thermally conductive fins of the at least one air-cooled heat sink and providing conductive heat transport from the at least one air-cooled heat sink to the respective thermally conductive coolant-carrying tube coupled to the thermally conductive auxiliary structure, and thereafter via convection to liquid coolant passing through the respective thermally conductive coolant-carrying tube.

4. The cooling system of claim 3, wherein a first thermally conductive auxiliary structure of the multiple thermally conductive auxiliary structures surrounds the thermally conductive coolant supply tube and a second thermally conductive auxiliary structure of the multiple thermally conductive auxiliary structures surrounds the thermally conductive coolant return tube, and wherein the first thermally conductive auxiliary structure and the second thermally conductive auxiliary structure both couple to the at least one air-cooled heat sink and are spaced apart to prevent direct thermal conduction therebetween.

5. The cooling system of claim 3, wherein each thermally conductive auxiliary structure and the respective thermally conductive fins of the plurality to thermally conductive fins extending from the at least one air-cooled heat sink define air channels therebetween, and wherein the cooling system further comprises an air moving device for establishing air flow across the multiple components of the electronics system, the air moving device establishing air flow through the air channels defined between each thermally conductive auxiliary structure and the respective thermally conductive fins extending from the at least one air-cooled heat sink.

6. The cooling system of claim 3, wherein each thermally conductive auxiliary structure includes a cylindrical opening sized to receive the respective thermally conductive coolant-carrying tube.

7. The cooling system of claim 1, wherein the thermally conductive auxiliary structure includes a plurality of thermally conductive folded fin structures extending from a surface thereof, and wherein when the cooling system is employed to cool the multi-component electronics system, with the at least one liquid-cooled cold plate coupled to the at least one primary heat generating component to be cooled, at least one thermally conductive folded fin structure of the plurality of thermally conductive folded fin structures couples to the at least one secondary heat generating component to be cooled.

8. The cooling system of claim 7, wherein the plurality of thermally conductive folded fin structures each comprise an air flow passage therethrough, and wherein the multi-component electronics system comprises multiple secondary heat generating components to be cooled, the multiple secondary heat generating components to be cooled being arrayed on a substrate with air flow passageways defined between adjacent secondary heat generating components of the multiple secondary heat generating components, and wherein when the cooling system is employed to cool the multi-component electronics system, at least some thermally conductive folded fin structures of the plurality of thermally conductive folded fin structures of the thermally conductive auxiliary structure extend into air flow passageways defined between adjacent secondary heat generating components of the multiple secondary heat generating components to be cooled and couple to the adjacent secondary heat generating components to provide conductive heat transport from the adjacent secondary heat generating components and to provide cooling of air flow passing through the air flow passages of the at least some thermally conductive folded fin structures.

9. The cooling system of claim 1, wherein the electronics system comprises multiple secondary heat generating components to be cooled, and wherein the at least one primary heat generating component comprises at least one processor module to be cooled, and the multiple secondary heat generating components comprise multiple memory modules and multiple memory support modules arrayed on a substrate, at least some memory support modules of the multiple memory support modules being aligned in at least one row, with the multiple memory modules being arrayed on at least one side thereof, and wherein when the cooling system is employed to cool the multi-component electronics system, the at least one thermally conductive coolant-carrying tube extends over the at least one row of memory support modules, and wherein the thermally conductive auxiliary structure is disposed to facilitate cooling of the at least one row of memory support modules.

10. A cooling system for a multi-component electronics system comprising at least one primary heat generating component to be cooled and at least one secondary heat generating component to be cooled, the cooling system comprising:
    a liquid-based cooling subsystem comprising at least one liquid-cooled cold plate configured to couple to the at least one primary heat generating component to be cooled of a multi-component electronics system, the liquid-based cooling subsystem further comprising at least one thermally conductive coolant-carrying tube coupled to and in fluid communication with the at least one liquid-cooled cold plate for facilitating passage of liquid coolant through the at least one liquid-cooled cold plate;
    a thermally conductive auxiliary structure coupled to the at least one thermally conductive coolant-carrying tube and configured to couple to the at least one secondary heat generating component to be cooled, wherein when the cooling system is in use with the at least one liquid-cooled cold plate coupled to the at least one primary heat generating component to be cooled and the thermally conductive auxiliary structure coupled to the at least one secondary heat generating component to be cooled, the thermally conductive auxiliary structure provides conductive heat transport from the at least one secondary heat generating component to the at least one thermally conductive coolant-carrying tube coupled thereto, and hence via convection to liquid coolant passing therethrough; and
    wherein the liquid-based cooling subsystem comprises multiple thermally conductive coolant-carrying tubes, the multiple thermally conductive coolant-carrying tubes comprising a thermally conductive coolant supply tube and a thermally conductive coolant return tube, and wherein the cooling system further comprises multiple thermally conductive auxiliary structures, each thermally conductive auxiliary structure being configured to couple to a respective thermally conductive coolant-carrying tube of the liquid-based cooling subsystem, and each thermally conductive auxiliary structure comprising a unitary structure at least partially aligned over and coupled to the at least one secondary heat generating component to be cooled, wherein a first thermally conductive auxiliary structure of the multiple thermally conductive auxiliary structures surrounds the thermally conductive coolant supply tube, and a second thermally conductive auxiliary structure of the multiple thermally conductive auxiliary structures surrounds the thermally conductive coolant return tube, the first thermally conductive auxiliary structure and the second thermally conductive auxiliary structure being spaced apart to prevent thermal conduction therebetween.

11. The cooling system of claim 10, wherein each thermally conductive auxiliary structure further comprises a cylindrical-shaped opening sized to receive the respective thermally conductive coolant-carrying tube of the liquid-based cooling subsystem, and wherein each thermally conductive auxiliary structure is sized to at least partially physically couple to the at least one secondary heat generating component to be cooled across a thermal interface material when the cooling system is employed to cool the multi-component electronics system, and wherein each thermally conductive auxiliary structure is fabricated of metal to facilitate conductive heat transport from the at least one secondary heat generating component to the respective thermally conductive coolant-carrying tube, and hence to liquid coolant passing therethrough via convection.

12. A cooled electronics system comprising:
    at least one electronics drawer containing multiple heat generating components to be cooled, the at least one electronics drawer comprising at least one primary heat generating component to be cooled and at least one secondary heat generating component to be cooled; and
    a cooling system for cooling the multiple components of the at least one electronics drawer, the cooling system comprising:
        a liquid-based cooling subsystem comprising at least one liquid-cooled cold plate coupled to the at least one primary heat generating component to be cooled, the liquid-based cooling subsystem further including at least one thermally conductive coolant-carrying tube coupled to and in fluid communication with the at least one liquid-cooled cold plate for facilitating passage of liquid coolant through the at least one liquid-cooled cold plate;
        a thermally conductive auxiliary structure coupled to the at least one thermally conductive coolant-carrying tube and coupled to the at least one secondary heat generating component to be cooled, the thermally conductive auxiliary structure providing conductive heat transport from the at least one secondary heat generating component to the at least one thermally conductive coolant-carrying tube, and hence via convection to liquid coolant passing therethrough; and
        at least one air-cooled heat sink coupled to the at least one secondary heat generating component to be cooled, the at least one air-cooled heat sink comprising a plurality of thermally conductive fins, and wherein the cooling system further comprises multiple thermally conductive auxiliary structures, each thermally conductive auxiliary structure comprising a rectangular-shaped structure surrounding a thermally conductive coolant-carrying tube of the at least one thermally conductive coolant-carrying tube, and at least partially aligned over and coupled to the at least one air-cooled heat sink coupled to the at least one secondary heat generating component to be cooled.

13. The cooled electronics system of claim 12, wherein the liquid-based cooling subsystem comprises multiple thermally conductive coolant-carrying tubes, the multiple thermally conductive coolant-carrying tubes comprising a thermally conductive coolant supply tube and a thermally conductive coolant return tube, and wherein each thermally conductive auxiliary structure is configured to couple to a respective thermally conductive coolant-carrying tube of the liquid-based cooling subsystem.

14. The cooled electronics system of claim 13, wherein each thermally conductive auxiliary structure comprises multiple channels formed in at least one surface thereof and configured to couple to respective thermally conductive fins of the plurality of thermally conductive fins of the at least one air-cooled heat sink, with each thermally conductive auxiliary structure physically coupling to the respective thermally conductive fins of the at least one air-cooled heat sink and providing conductive heat transport from the at least one air-cooled heat sink to the respective thermally conductive coolant-carrying tube surrounded by the thermally conductive auxiliary structure, and thereafter via convection to liquid coolant passing through the respective thermally conductive coolant-carrying tube.

15. The cooled electronics system of claim 12, wherein the liquid-based cooling subsystem comprises multiple thermally conductive coolant-carrying tubes, the multiple thermally conductive coolant-carrying tubes comprising a thermally conductive coolant supply tube and a thermally conductive coolant return tube, and wherein the cooling system further comprises multiple thermally conductive auxiliary structures, each thermally conductive auxiliary structure being coupled to a respective thermally conductive coolant-carrying tube of the liquid-based cooling subsystem, and each thermally conductive auxiliary structure comprising a unitary structure at least partially aligned over and coupled to the at least one secondary heat generating component to be cooled, wherein a first thermally conductive auxiliary structure of the multiple thermally conductive auxiliary structures surrounds the thermally conductive coolant supply tube, and a second thermally conductive auxiliary structure of the multiple thermally conductive auxiliary structures surrounds the thermally conductive coolant return tube are spaced apart to prevent thermal conduction therebetween.

16. The cooled electronics system of claim 12, wherein the thermally conductive auxiliary structure includes a plurality of thermally conductive folded fin structures extending from a surface thereof, and wherein at least one thermally conductive folded fin structure of the plurality of thermally conductive folded fin structures couples to the at least one secondary heat generating component to be cooled.

17. The cooled electronics system of claim 16, wherein the plurality of thermally conductive folded fin structures each comprise an air flow passage therethrough, and wherein the multi-component electronics system comprises multiple secondary heat generating components to be cooled, the multiple secondary heat generating components to be cooled being arrayed on a substrate with air flow passageways defined between adjacent secondary heat generating components of the multiple secondary heat generating components, and wherein at least some thermally conductive folded fin structures of the plurality of thermally conductive folded fin structures extend into air flow passageways defined between adjacent secondary heat generating components of the multiple secondary heat generating components to be cooled and couple to the adjacent secondary heat generating components to provide conductive heat transport from the adjacent secondary heat generating components and to provide cooling of air flow passing through the air flow passages of the at least some thermally conductive folded fin structures.

\* \* \* \* \*